(12) United States Patent
Zhang et al.

(10) Patent No.: US 11,362,033 B2
(45) Date of Patent: Jun. 14, 2022

(54) SEMICONDUCTOR STRUCTURE AND METHOD FOR FABRICATING THE SAME

(71) Applicants: Semiconductor Manufacturing International (Shanghai) Corporation, Shanghai (CN); Semiconductor Manufacturing International (Beijing) Corporation, Beijing (CN)

(72) Inventors: Haiyang Zhang, Shanghai (CN); Panpan Liu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/034,612

(22) Filed: Sep. 28, 2020

(65) Prior Publication Data

US 2021/0134722 A1    May 6, 2021

(30) Foreign Application Priority Data

Nov. 5, 2019   (CN) .......................... 201911072323.0

(51) Int. Cl.
| | |
|---|---|
| *H01L 23/528* | (2006.01) |
| *H01L 27/088* | (2006.01) |
| *H01L 29/66* | (2006.01) |
| *H01L 29/78* | (2006.01) |
| *H01L 21/8234* | (2006.01) |
| *H01L 29/40* | (2006.01) |
| *H01L 29/423* | (2006.01) |

(52) U.S. Cl.
CPC .. *H01L 23/5286* (2013.01); *H01L 21/823431* (2013.01); *H01L 21/823475* (2013.01); *H01L 21/823481* (2013.01); *H01L 27/0886* (2013.01); *H01L 29/401* (2013.01); *H01L 29/42356* (2013.01); *H01L 29/66795* (2013.01); *H01L 29/785* (2013.01)

(58) Field of Classification Search
CPC ......... H01L 21/823481; H01L 29/7855; H01L 29/42356; H01L 29/785; H01L 23/5286
See application file for complete search history.

(56) References Cited

U.S. PATENT DOCUMENTS

2020/0098681 A1 * 3/2020 Kim .................... H01L 27/0924

* cited by examiner

*Primary Examiner* — Changhyun Yi
(74) *Attorney, Agent, or Firm* — Anova Law Group, PLLC (57) ABSTRACT

Semiconductor structure and fabrication method are provided. The method includes providing a substrate including a first region and a second region; forming a plurality of fins on the first region of the substrate; forming an isolation structure on the first region and the second region of the substrate; forming a gate structure across the plurality of fins and on the isolation structure at the first region; etching the isolation structure and the substrate at the second region to form a first opening; filling the first opening with a conductive material layer; and etching the gate structure till exposing the isolation structure to form a second opening in the gate structure and removing a portion of the conductive material layer in the first opening to form a power rail.

20 Claims, 7 Drawing Sheets

SEMICONDUCTOR STRUCTURE AND METHOD FOR FABRICATING THE SAME

CROSS-REFERENCE TO RELATED APPLICATION

This application claims the priority of Chinese Patent Application No. 201911072323.0, filed on Nov. 5, 2019, the content of which is incorporated herein by reference in its entirety.

TECHNICAL FIELD

The present disclosure generally relates to the field of semiconductor manufacturing and, more particularly, relates to a semiconductor structure and a fabrication method of the semiconductor structure.

BACKGROUND

With rapid development of semiconductor manufacturing technology, semiconductor devices present a development trend of higher element density and higher level of integration. As integrated circuits (ICs) advance, the complexity of IC processing and manufacturing has increased while the semiconductor device size (e.g., minimum size of device element) is reduced.

In IC manufacturing, standard cells, used as basic elements for fabricating IC devices, are arranged and wired to form functional circuits. Each standard cell needs a power (Vdd) input and a ground (Vss) connection when in use. In order to supply power to a variety of components, each standard cell is coupled to a power rail, which is electrically connected to an active layer of the standard cell, to supply the power (Vdd). In certain cases, a plurality of power rails may be provided to each standard cell to respectively provide the power (Vdd) input and the ground (Vss) connection.

The standard cell may be designed to be a stacked structure having various metal layers, and each metal layer may include wiring traces. Various interconnection elements may be formed in the wiring traces to allow connections between various components of the standard cell and to allow connections of various components of the standard cell with other standard cells.

The standard cells may be any types of cells and may have different device architectures. For example, the standard cell may be a common multi-gate device including a fin field effect transistor (Fin FET). In a Fin FET, a fin structure may extend from a substrate and be configured to form an FET channel and source/drain regions. A gate electrode may be formed across the fin structure to provide an increased surface area for the channel, thereby forming semiconductor devices that are faster, more reliable and better controllable.

However, as the size of the semiconductor device shrinks and the device density increases, the process difficulty for fabricating the fin field effect transistor may increase, and device performance of the fabricated fin field effect transistor may be instable.

SUMMARY

One aspect of the present disclosure provides a method for fabricating a semiconductor structure. The method includes providing a substrate including a first region and a second region, and forming a plurality of fins on the first region of the substrate; forming an isolation structure on the first region and the second region of the substrate; forming a gate structure across the plurality of fins and on the isolation structure at the first region; etching the isolation structure and the substrate at the second region to form a first opening; filling the first opening with a conductive material layer; and etching the gate structure till exposing the isolation structure to form a second opening in the gate structure and removing a portion of the conductive material layer in the first opening to form a power rail.

Optionally, after the second opening and the power rail are formed, the method further includes filling the second opening with a dielectric layer.

Optionally, the conductive material layer is made of a material including ruthenium, copper, graphene, or a combination thereof.

Optionally, the first opening is filled with the conductive material layer by an electrochemical deposition process.

Optionally, the dielectric layer is made of a material including silicon nitride, silicon oxynitride, silicon oxide, silicon carbide, or a combination thereof.

Optionally, the method further includes simultaneously etching the gate structure and removing the portion of the conductive material layer.

Optionally, etching the gate structure and removing the portion of the conductive material layer includes a dry etching process including an etching gas, including carbon tetrafluoride, boron trichloride, oxygen, chlorine, helium, or a combination thereof; an etching pressure of about 2 mTorr to about 100 mTorr; and an etching temperature of about 0° C. to about 150° C.

Optionally, etching the isolation structure and the substrate at the second region includes etching the isolation structure at the second region till exposing a surface of the substrate to form a first trench; and along the first trench, continuously etching a portion of the substrate to form the first opening.

Optionally, etching the isolation structure at the second region includes forming a hard mask layer on the gate structure at the first region and on the isolation structure at the second region; forming a first patterned photoresist layer on the hard mask layer; using the first patterned photoresist layer as a mask, etching the hard mask layer to form a third opening, where the third opening exposes a portion of the isolation structure at the second region; and along the third opening, etching the isolation structure at the second region till exposing the surface of the substrate to form the first trench.

Optionally, the hard mask layer includes a first hard mask layer, on each of the gate structure and the isolation structure, and a second hard mask layer on the first hard mask layer.

Optionally, after filling the first opening with the conductive material layer, the second hard mask layer is removed.

Optionally, etching the gate structure and the conductive material layer includes forming a second patterned photoresist layer on the first hard mask layer; using the second patterned photoresist layer as a mask, etching the first hard mask layer to form a fourth opening, where the fourth opening exposes a portion of the gate structure at the first region; along the fourth opening, etching the portion of the gate structure till exposing the surface of the isolation structure to form the second opening; and along the third opening, removing the portion of the conductive material layer in the first opening.

Optionally, the first hard mask layer is a hybrid layer including silicon oxide and silicon nitride; and the second hard mask layer is a hybrid layer including titanium oxide and titanium nitride.

Another aspect of the present disclosure provides a semiconductor structure. The semiconductor structure includes a substrate, including a first region and a second region; a plurality of fins, formed on the first region of the substrate; an isolation structure, formed on the first region between adjacent fins and on the second region of the substrate; a gate structure, across the plurality of fins and on the isolation structure at the first region; a dielectric layer, formed through the gate structure on the isolation structure and over the first region of the substrate; and a power rail, formed in the isolation structure and partially in the substrate of the second region.

Optionally, the power rail has a top surface lower than a top surface of the isolation structure.

Optionally, the dielectric layer is made of a material including silicon nitride, silicon oxynitride, silicon oxide, silicon carbide, or a combination thereof.

Optionally, the power rail is made of a material including ruthenium, copper, graphene, or a combination thereof.

Optionally, the semiconductor structure further includes a hard mask layer formed over the gate structure and the isolation structure, where the hard mask layer is a hybrid layer including silicon oxide and silicon nitride.

Optionally, the dielectric layer is further formed through the hard mask layer.

Optionally, an opening is formed over the power rail, the opening having a sidewall formed by sidewalls of the isolation structure and the hard mask layer.

Compared with the existing technology, the technical solutions provided by the present disclosure may achieve at least the following beneficial effects.

The first opening may be formed in the isolation structure and the substrate at the second region, and the conductive material layer may be filled in the first opening. When cutting the gate structure at the first region, the portion of the conductive material layer in the first opening may be simultaneously etched to form the power rail, which may simplify the process flow for cutting the gate structure and forming the power rail. Furthermore, the portion of the formed power rail may be buried in the substrate to release the space occupied by the wiring traces in the metal layers of the standard cell. When a same response speed of the semiconductor structure is satisfied, the size of the standard cell may be reduced, which is beneficial for the advancement to the next process node of the semiconductor technology; or under a same size of the standard cell, more space may be available for the wiring traces, thereby improving the performance of the semiconductor structure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A semiconductor structure and its fabrication method are provided in the present disclosure. The method includes providing a substrate including a first region and a second region; forming a plurality of fins on the first region of the substrate; forming an isolation structure on the first region and the second region of the substrate; forming a gate structure across the plurality of fins and on the isolation structure at the first region; etching the isolation structure and the substrate at the second region to form a first opening; filling the first opening with a conductive material layer; and etching the gate structure till exposing the isolation structure to form a second opening in the gate structure and removing a portion of the conductive material layer in the first opening to form a power rail.

When a power rail is used to supply power to the standard cell in the integrated circuit, the power rail is arranged in one or more of the metal layers of the standard cell. A conduction path is then used to connect the metal layer and the power rail that is connected between metal layers or used to connect the power rail to the active layer of the standard cell. The metal layer includes wiring traces; and the more wiring traces are, the faster the response speed of the semiconductor structure is. The arrangement of the power rail in the metal layer may cause the reduction of the space available for wiring traces, resulting in a decrease in the semiconductor speed and affecting the device performance of the semiconductor structure. Therefore, there is a need to fabricate a semiconductor structure with a buried power rail, where a portion of the power rail may be buried in the substrate and located at a same layer as the active layer of the standard cell.

Furthermore, in the process of fabricating the semiconductor structure, there is a need to cut the formed gate structure (MG) (i.e., MGC) to form the semiconductor structure that meets requirements.

Various embodiments of the present disclosure provide a semiconductor structure and its fabrication method. For example, a first opening may be formed in the isolation structure and a substrate at a second region and may be filled with a conductive material layer. When cutting a gate structure, the conductive material layer in the first opening may also be etched to form a power rail, such that the gate cut structure and the power rail may be formed simultaneously, which may simplify the process flow of the semiconductor structure, improve the production efficiency and save costs; and a portion of the power rail is buried in the substrate to release the space occupied by the wiring traces in the metal layers, which may improve the response speed of the semiconductor structure, reduce the standard cell size, and improve the performance of the semiconductor structure.

In order to clearly illustrate the above-mentioned described objectives, features, and advantages of the present disclosure, various embodiments of the present disclosure are described in detail with reference to the accompanying drawings hereinafter.

FIGS. 1-10 illustrate structural schematics corresponding to certain stages of a method for forming an exemplary semiconductor structure according to various disclosed embodiments of the present disclosure.

Figure 1:
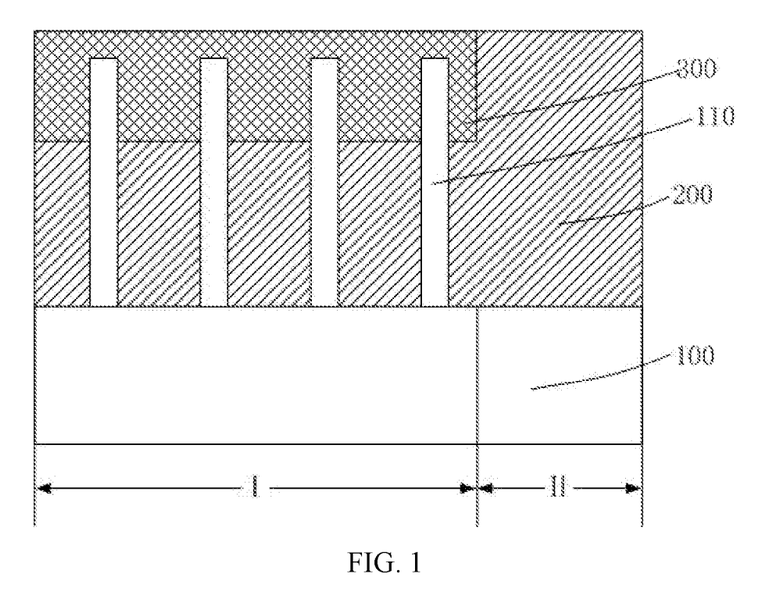
FIGS. 1-10 illustrate structural schematics corresponding to certain stages of a method for forming an exemplary semiconductor structure according to various disclosed embodiments of the present disclosure.
Figure 11:
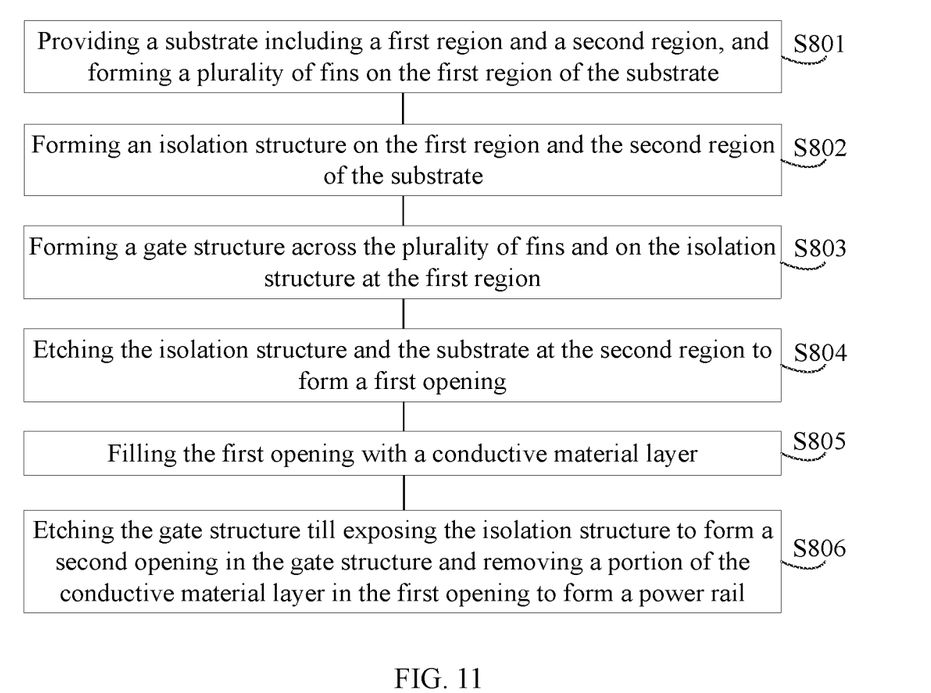
FIG. 11 illustrates a flowchart of an exemplary fabrication method for forming a semiconductor structure according to various disclosed embodiments of the present disclosure.

Referring to FIG. 1, a substrate 100, including a first region I and a second region II adjacent to each other, may be provided; and a plurality of fins 110 may be formed on the first region I of the substrate 100 (e.g., in S801 of FIG. 11).

In one embodiment, the substrate 100 may be a silicon substrate. In other embodiments, the substrate 100 may also be any one of a germanium substrate, a silicon germanium substrate, a silicon carbide substrate, a silicon-on-insulator, a germanium-on-insulator substrate, and/or any other suitable substrate(s).

In one embodiment, the fin 110 may be made of silicon. In other embodiments, the fin 110 may be made of a material including germanium, silicon germanium, and/or any other suitable material(s).

In one embodiment, forming the fin 110 on the first region I of the substrate 100 may include forming a patterned layer (not shown) on the substrate 100, where the patterned layer corresponds to the position where the fin 110 needs to be formed on the first region I of the substrate 100; using the patterned layer as a mask, etching a portion of the substrate 100 at the first region I to form the plurality of discrete fins 110; and removing the patterned layer.

The spacings between adjacent formed fins 110 may be equal or not equal to each other.

Referring to FIG. 1, an isolation structure 200 may be formed on the first region I and the second region II of the substrate 100 (e.g., in S802 of FIG. 11).

In one embodiment, the isolation structure 200 may be made of silicon dioxide. In other embodiments, the isolation structure 200 may also be made of silicon oxynitride, silicon nitride, and/or any other suitable material(s).

In one embodiment, the top surface of the isolation structure 200 may be higher than the top surface of the fin 110.

In one embodiment, the isolation structure 200 may be used to isolate adjacent fins 110 to prevent subsequent leakage, short circuit, and other phenomena.

In one embodiment, forming the isolation structure 200 may include depositing an isolation material layer on the first region I and the second region II of the substrate 100, where the isolation material layer may cover the surface of the substrate 100, the sidewalls and the top surfaces of the fins 110 at the first region I; and performing a chemical mechanical planarization process on the isolation material layer to form the isolation structure 200.

In one embodiment, the isolation material layer may be deposited using a fluid chemical vapor deposition process, such that the filling performance of the isolation material layer may be desirable.

Referring to FIG. 1, after forming the isolation structure 200, a gate structure 300 across the fins 110 and on the isolation structure 200 at the first region I may be formed (e.g., in S803 of FIG. 11).

In one embodiment, before forming the gate structure 300, the isolation structure 200 at the first region I may be etched first to expose the top and a portion of the sidewalls of the fins 110.

In one embodiment, the gate structure 300 may cover the top and the portion of the sidewalls of the fin 110 at the first region I, and also cover the isolation structure 200 at the first region I.

In one embodiment, the top surface of the formed gate structure 300 may be coplanar with the top surface of the isolation structure 200 at the second region II.

In one embodiment, the gate structure 300 may include a gate dielectric layer on the surfaces of the fins 110 and a gate layer on the gate dielectric layer.

In one embodiment, the gate layer may be made of a metal including TiN, TiAl, W, and/or any other suitable material(s).

After forming the gate structure 300, the isolation structure 200 and the substrate 100 at the second region II may be etched to form a first opening.

In one embodiment, the isolation structure 200 and the substrate 100 at the second region II may be etched stepwise. A portion of the isolation structure 200 at the second region II may be etched first till exposing the surface of the substrate 100, and then a portion of the substrate 100 may be etched.

For example, etching the portion of the isolation structure 200 at the second region II may be described hereinafter.

Figure 2:
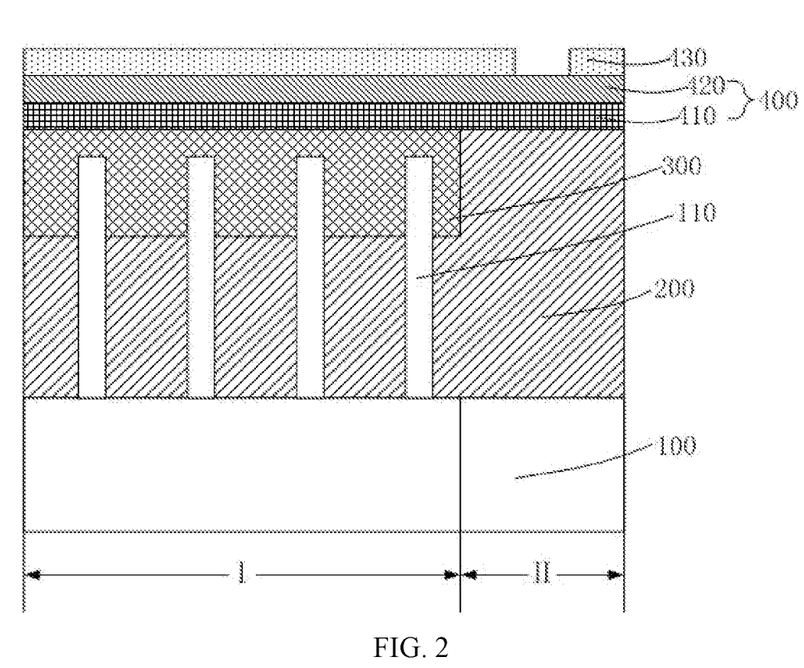

Referring to FIG. 2, a hard mask layer 400 may be formed on the surface of the gate structure 300 at the first region I and the surface of the isolation structure 200 at the second region II.

In one embodiment, the hard mask layer 400 includes a first hard mask layer 410 on the surfaces of the gate structure 300 and the isolation structure 200, and a second hard mask layer 420 on the surface of the first hard mask layer 410.

In one embodiment, the material of the first hard mask layer 410 may be a hybrid layer of silicon oxide and silicon nitride. In other embodiments, the first hard mask layer 410 may also be a hybrid layer of silicon oxide and silicon carbide.

In one embodiment, the material of the second hard mask layer 420 may be a hybrid layer of titanium oxide and titanium nitride. In other embodiments, the second hard mask layer 420 may also be a hybrid layer of oxide and aluminum nitride or oxide and boron nitride.

In one embodiment, forming the hard mask layer 400 may include forming the first hard mask layer 410 on the surface of the gate structure 300 at the first region I and the surface of the isolation structure 200 at the second region II, and forming the second hard mask layer 420 on the surface of the first hard mask layer 410.

The first hard mask layer 410 may be formed by a process including a chemical vapor deposition process, a physical vapor deposition process, an atomic layer deposition process, or a combination thereof. The second hard mask layer 420 may be formed by a process including a chemical vapor deposition process, a physical vapor deposition process, an atomic layer deposition process, or a combination thereof.

Referring to FIG. 2, a first patterned photoresist layer 430 may be formed on the hard mask layer 400.

In one embodiment, forming the first patterned photoresist layer 430 may include depositing a first photoresist material on the surfaces of the gate structure 300 and the isolation structure 200; and developing and exposing the first photoresist material to form the first patterned photoresist layer 430. The first patterned photoresist layer 430 may expose a portion of the hard mask layer 400 on the surface of the isolation structure 200 at the second region II.

Figure 3:
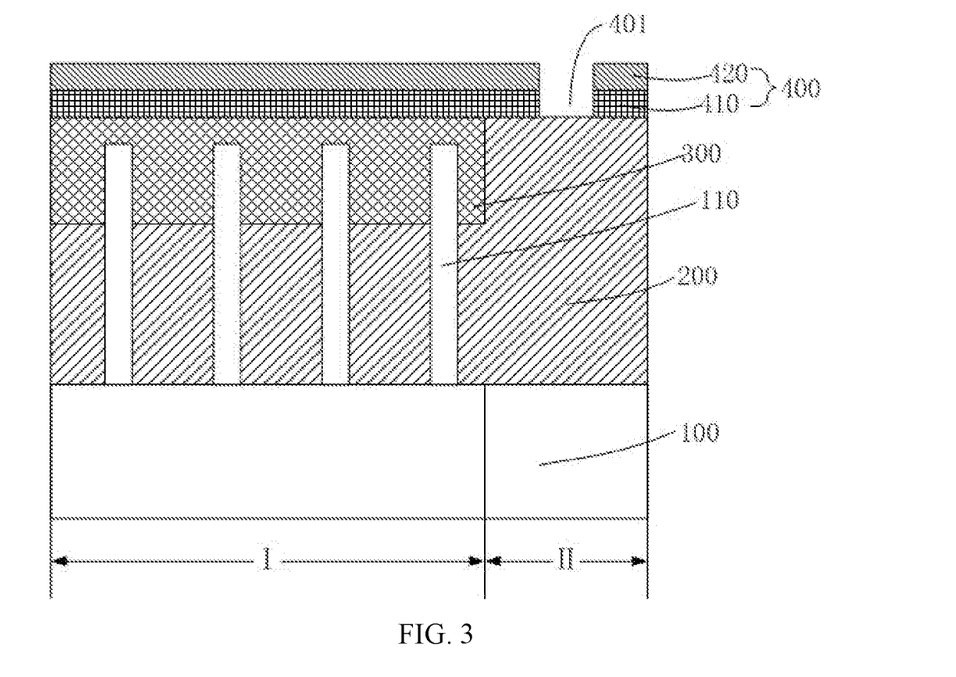

Referring to FIG. 3, using the first patterned photoresist layer 430 as a mask, the hard mask layer 400 may be etched to form a third opening 401. The third opening 401 may expose a portion of the isolation structure 200 at the second region II.

In one embodiment, etching the hard mask layer 400 may include first etching the second hard mask layer 420 till exposing the surface of the first hard mask layer 410, and then etching the first hard mask layer 410 till exposing the surface of the isolation structure 200.

In one embodiment, the second hard mask layer 420 may be etched by a dry etching process. The etching gas of the dry etching process may include trifluoromethane (CHF$_3$), carbon tetrafluoride (CF$_4$), fluoromethane (CH$_3$F), oxygen, or a combination thereof.

In one embodiment, the first hard mask layer 410 may be etched by a dry etching process. The etching gas of the dry etching process may include chlorine, oxygen, methane (CH$_4$), or a combination thereof.

After the third opening 401 is formed, the first patterned photoresist layer 430 may be removed by a wet etching process or an ashing process.

Figure 4:
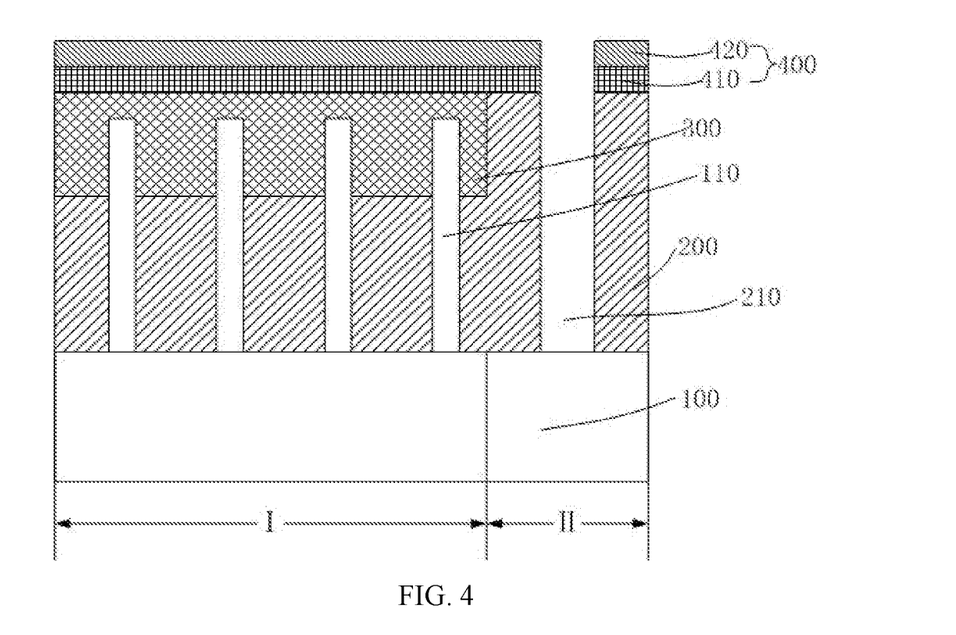

Referring to FIG. 4, the exposed isolation structure 200 at the second region II may be etched along the third opening 401 till exposing the surface of the substrate 100 to form a first trench 210.

In one embodiment, the isolation structure 200 may be etched by a plasma dry etching process. The process parameters of the plasma dry etching process may include the etching gas, including trifluoromethane (CHF$_3$), carbon tetrafluoride (CF$_4$), fluoromethane (CH$_3$F), oxygen, or a combination thereof, and include the etching pressure of about 5 mTorr to about 100 mTorr, and the etching temperature of about 10° C. to about 120° C.

Figure 5:
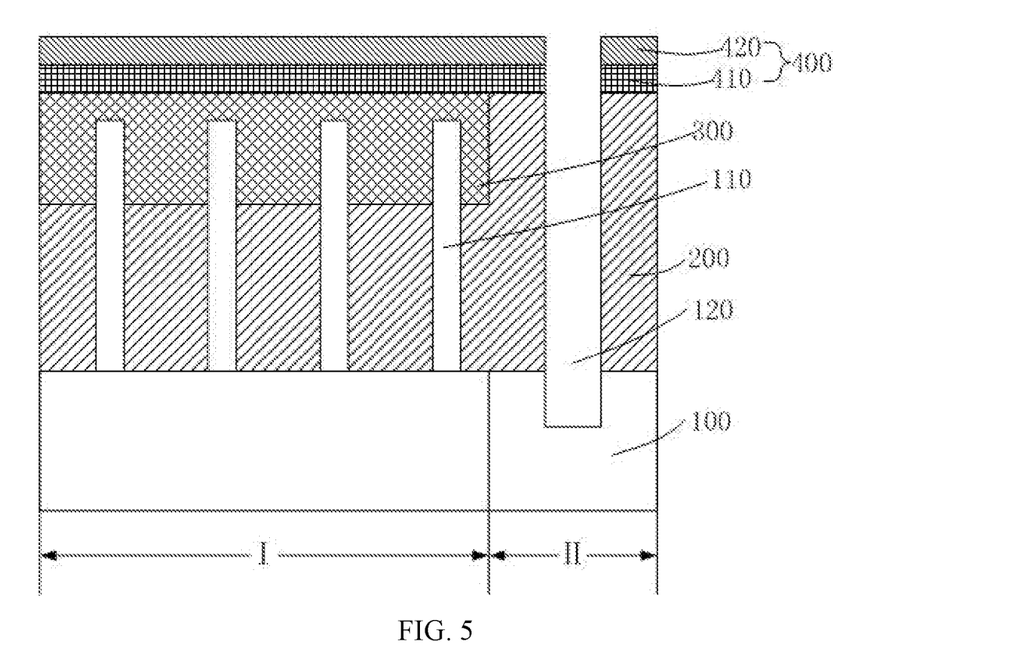

Referring to FIG. 5, a portion of the substrate 100 may be etched along the first trench 210 to form a first opening 120 (e.g., in S804 of FIG. 11).

In one embodiment, the thickness of the etched substrate 100 may be about 300 Å to about 1000 Å. The thickness to-be-etched of the substrate 100 may be selected according to actual process requirements.

In one embodiment, the substrate 100 may be etched by a plasma dry etching process. The process parameters of the plasma dry etching process may include the etching gas, including hydrogen bromide (HBr), trifluoride Nitrogen (NF$_3$), chlorine, oxygen, or any combination thereof, and include the etching pressure of about 5 mTorr to about 100 mTorr, and the etching temperature of about 10° C. to about 120° C.

Figure 6:
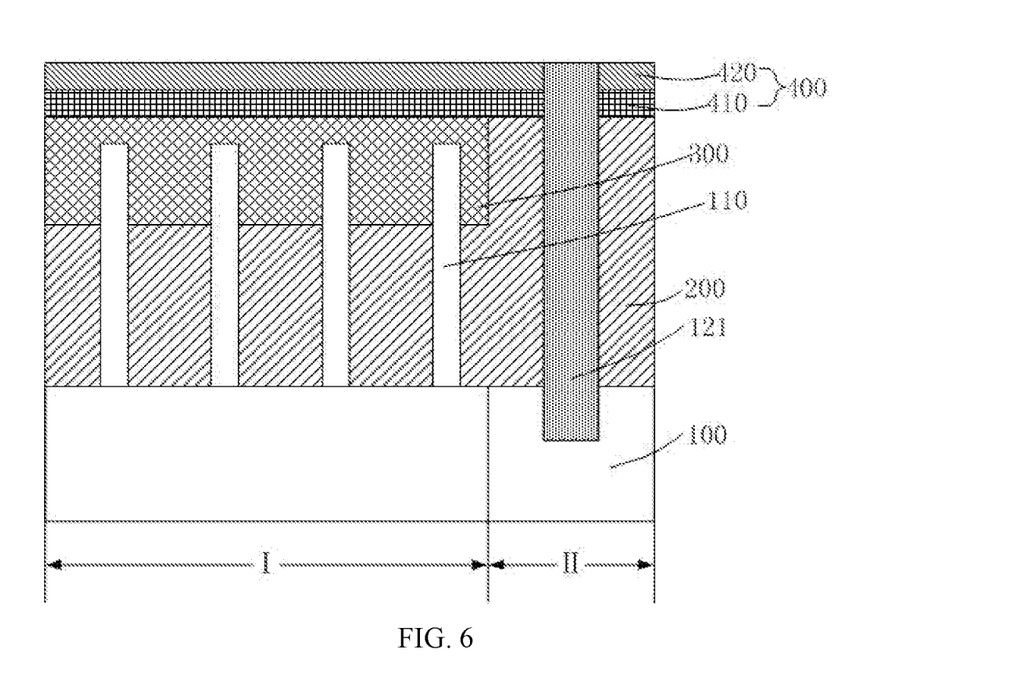

Referring to FIG. 6, after the first opening 120 is formed, a conductive material layer 121 may be filled in the first opening 120 (e.g., in S805 of FIG. 11).

In one embodiment, after the conductive material layer 121 is formed, a chemical mechanical polishing process may be further performed on the conductive material layer 121.

In one embodiment, the conductive material layer 121 may be made of ruthenium (Ru). In other embodiments, the conductive material layer 121 may also be made of copper (Cu), graphene, and/or any other suitable material(s).

In one embodiment, ruthenium may be used as the material for forming the power rail. Ruthenium has desirable electrical conductivity, high temperature and corrosion resistance, and excellent electrical performance. It may be an excellent choice for replacing original conductive materials such as copper in the next semiconductor technological process.

In one embodiment, filling the conductive material layer 121 may be performed by an electrochemical deposition process.

Figure 7:
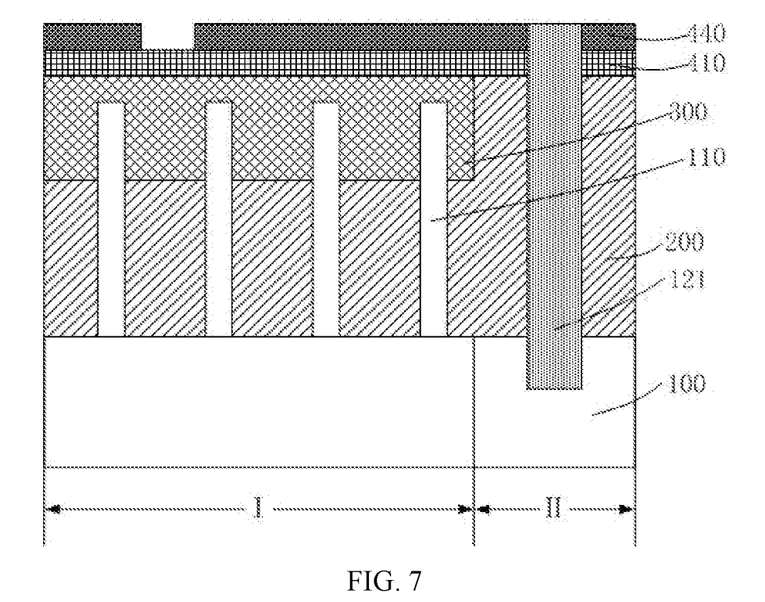

It should be noted that, in one embodiment, when the chemical mechanical polishing process is performed on the conductive material layer 121, the second hard mask layer 420 may also be removed by polishing (referring to FIG. 7). The first hard mask layer 410 may serve as a polishing stop layer for the chemical mechanical polishing process, and may also serve as a protective layer for the isolation structure 200 and the gate structure 300 to prevent the isolation structure 200 and the gate structure 300 from being damaged during the chemical mechanical polishing process.

Referring to FIG. 7, a second patterned photoresist layer 440 may be formed on the first hard mask layer 410.

In one embodiment, the second patterned photoresist layer 440 may expose a portion of the first hard mask layer 410 on the surface of the gate structure 300 at the first region I.

Figure 8:
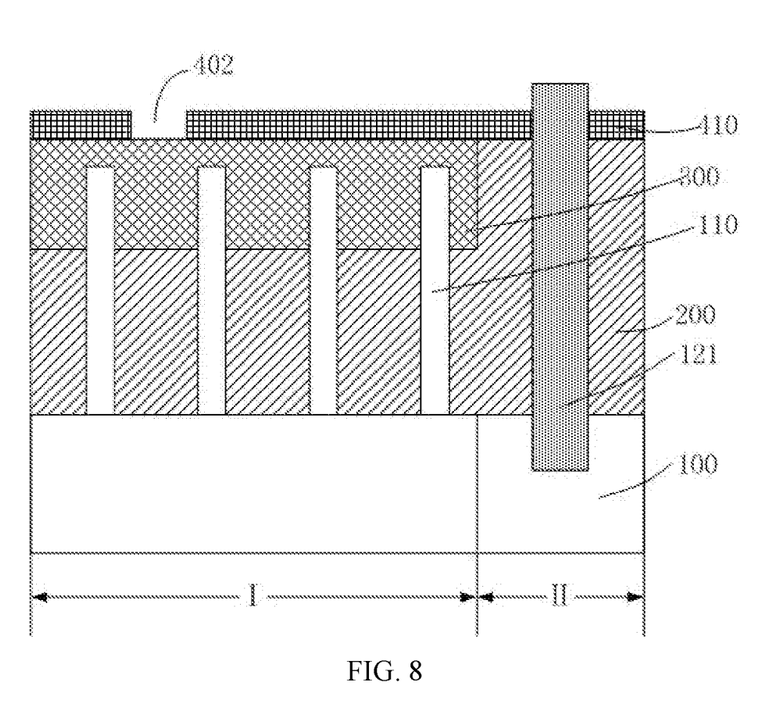

Referring to FIG. 8, using the second patterned photoresist layer 440 as a mask, the first hard mask layer 410 may be etched to form a fourth opening 402. The fourth opening 402 may expose a portion of the gate structure 300 at the first region I.

For example, the exposed position of the gate structure 300 may be determined according to the cutting position of the gate in an actual process.

After the fourth opening 402 is formed, the second patterned photoresist layer 440 may be removed by a wet etching process or an ashing process.

Figure 9:
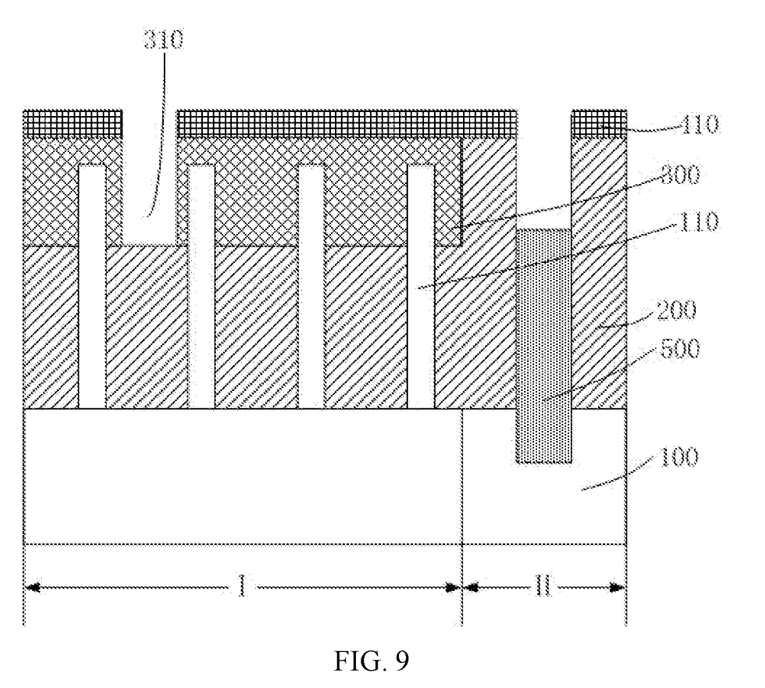

Referring to FIG. 9, a portion of the gate structure 300 may be etched along the fourth opening 402 till exposing the surface of the isolation structure 200 to form a second opening 310 in the gate structure 300; meanwhile, a portion of the conductive material layer 121 in the first opening 120 may be removed by etching along the third opening 401 to form a power rail 500 (e.g., in S806 of FIG. 11).

In one embodiment, the gate structure 300 and the conductive material layer 121 may be simultaneously etched using a dry etching process. An additional mask is not needed to be added in the dry etching process to simplify the process.

In one embodiment, the process parameters of the dry etching process may include the etching gas, including carbon tetrafluoride (CF$_4$), boron trichloride (BCl$_3$), oxygen, chlorine, helium, or a combination thereof, where the flow rate of carbon tetrafluoride is about 0 sccm to 100 sccm, the flow rate of boron trichloride is about 30 sccm to about 500 sccm, the flow rate of oxygen is about 0 sccm to about 100 sccm, the flow rate of chlorine is about 0 sccm to about 100 sccm, and the flow rate of helium is about 50 sccm to about 500 sccm, and further include the etching pressure of about 2 mTorr to about 100 mTorr, and the etching temperature of about 0° C. to about 150° C.

According to the fabrication method provided by the embodiments of the present disclosure, the gate structure 300 and the conductive material layer 121 may be etched simultaneously, the second opening 310 may be formed in the gate structure 300, the power rail 500 may be formed in the first opening 120, and the second opening 310 may be filled with a dielectric layer (e.g., dielectric layer 311 in FIG. 10) to form the gate cut structure subsequently. Forming the gate cut structure and the power rail simultaneously may simplify the process flow of the semiconductor structure and improve the production efficiency. Furthermore, A portion of the formed power rail 500 may be buried in the substrate 100 and at a same layer as the active layer of the standard cell, such that the space occupied by the wiring traces in the metal layers may be released, which may improve the response speed of the semiconductor structure, reduce the standard cell size, and improve the performance of the semiconductor structure.

Figure 10:
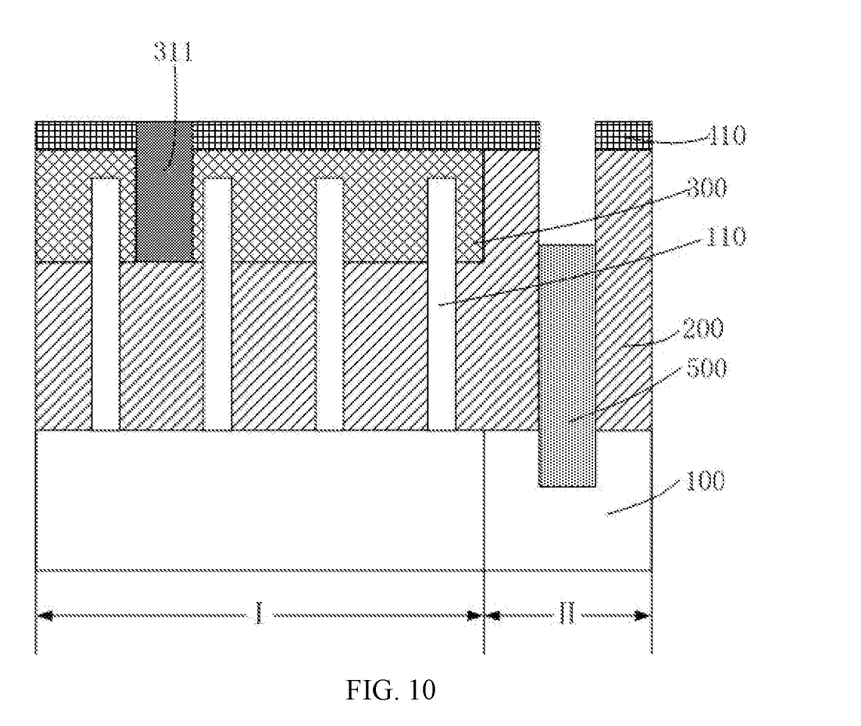

Referring to FIG. 10, in one embodiment, after forming the second opening 310, the second opening 310 may be filled with a dielectric layer 311.

The dielectric layer 311 may be made of a material including silicon nitride, silicon oxynitride, silicon oxide, silicon carbide, and/or any other available material(s).

In one embodiment, the dielectric layer 311 may be filled in the second opening 310 by a chemical vapor deposition process. In other embodiments, a physical vapor deposition process or an atomic layer deposition process may also be used for filling the dielectric layer 311.

In one embodiment, the dielectric layer 311 may be used to isolate the gate structure 300, such that the gate structure 300 may become a cut structure.

In one embodiment, after forming the power rail 500, a metal layer (not shown) may also be formed on the power rail 500.

The metal layer may be made of a metal material including cobalt, tungsten, copper, ruthenium, platinum, and/or any other suitable material(s).

In one embodiment, forming the metal layer may include filling the dielectric layer 311 on the power rail 500 while filling the dielectric layer 311 in the second opening 310; performing the chemical mechanical planarization on the dielectric layer 311; and removing the dielectric layer 311 on the power rail 500 and forming the metal layer on the power rail 500.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A method for fabricating a semiconductor structure, comprising:
    providing a substrate including a first region and a second region, and forming a plurality of fins on the first region of the substrate;
    forming an isolation structure on the first region and the second region of the substrate;
    forming a gate structure across the plurality of fins and on the isolation structure at the first region;
    etching the isolation structure and the substrate at the second region to form a first opening;
    filling the first opening with a conductive material layer; and
    etching the gate structure till exposing the isolation structure to form a second opening in the gate structure and removing a portion of the conductive material layer in the first opening to form a power rail.

2. The method according to claim 1, wherein after the second opening and the power rail are formed, the method further includes:
    filling the second opening with a dielectric layer.

3. The method according to claim 2, wherein:
    the dielectric layer is made of a material including silicon nitride, silicon oxynitride, silicon oxide, silicon carbide, or a combination thereof.

4. The method according to claim 1, wherein:
    the conductive material layer is made of a material including ruthenium, copper, graphene, or a combination thereof.

5. The method according to claim 1, wherein:
    the first opening is filled with the conductive material layer by an electrochemical deposition process.

6. The method according to claim 1, further including:
    simultaneously etching the gate structure and removing the portion of the conductive material layer.

7. The method according to claim 1, wherein etching the gate structure and removing the portion of the conductive material layer includes a dry etching process including:
    an etching gas, including carbon tetrafluoride, boron trichloride, oxygen, chlorine, helium, or a combination thereof;
    an etching pressure of about 2 mTorr to about 100 mTorr; and
    an etching temperature of about 0° C. to about 150° C.

8. The method according to claim 1, wherein etching the isolation structure and the substrate at the second region includes:
    etching the isolation structure at the second region till exposing a surface of the substrate to form a first trench; and
    along the first trench, continuously etching a portion of the substrate to form the first opening.

9. The method according to claim 8, wherein etching the isolation structure at the second region includes:
    forming a hard mask layer on the gate structure at the first region and on the isolation structure at the second region;
    forming a first patterned photoresist layer on the hard mask layer;
    using the first patterned photoresist layer as a mask, etching the hard mask layer to form a third opening, wherein the third opening exposes a portion of the isolation structure at the second region; and
    along the third opening, etching the isolation structure at the second region till exposing the surface of the substrate to form the first trench.

10. The method according to claim 9, wherein:
    the hard mask layer includes a first hard mask layer, on each of the gate structure and the isolation structure, and includes a second hard mask layer on the first hard mask layer.

11. The method according to claim 10, wherein:
    after filling the first opening with the conductive material layer, the second hard mask layer is removed.

12. The method according to claim 11, wherein etching the gate structure and the conductive material layer includes:
    forming a second patterned photoresist layer on the first hard mask layer;
    using the second patterned photoresist layer as a mask, etching the first hard mask layer to form a fourth opening, wherein the fourth opening exposes a portion of the gate structure at the first region;
    along the fourth opening, etching the portion of the gate structure till exposing the surface of the isolation structure to form the second opening; and
    along the third opening, removing the portion of the conductive material layer in the first opening.

13. The method according to claim 10, wherein:
    the first hard mask layer is a hybrid layer including silicon oxide and silicon nitride; and
    the second hard mask layer is a hybrid layer including titanium oxide and titanium nitride.

14. A semiconductor structure, comprising:
    a substrate, including a first region and a second region;
    a plurality of fins, formed on the first region of the substrate;
    an isolation structure, formed on the first region between adjacent fins and on the second region of the substrate;
    a gate structure, across the plurality of fins and on the isolation structure at the first region, wherein the isolation structure has a first top surface in the second region coplanar with a top surface of the gate structure and a second top surface in the first region lower than the top surface of the gate structure;
    a dielectric layer, formed through the gate structure on the isolation structure and over the first region of the substrate; and a power rail, formed in the isolation structure and partially in the substrate of the second region.

15. The semiconductor structure according to claim 14, wherein:
the power rail has a top surface lower than a top surface of the isolation structure.

16. The semiconductor structure according to claim 14, wherein:
the dielectric layer is made of a material including silicon nitride, silicon oxynitride, silicon oxide, silicon carbide, or a combination thereof.

17. The semiconductor structure according to claim 14, wherein:
the power rail is made of a material including ruthenium, copper, graphene, or a combination thereof.

18. A semiconductor structure, comprising:
a substrate, including a first region and a second region;
a plurality of fins, formed on the first region of the substrate;
an isolation structure, formed on the first region between adjacent fins and on the second region of the substrate;
a gate structure, across the plurality of fins and on the isolation structure at the first region;
a dielectric layer, formed through the gate structure on the isolation structure and over the first region of the substrate; and
a power rail, formed in the isolation structure and partially in the substrate of the second region,
a hard mask layer formed over the gate structure and the isolation structure, wherein the hard mask layer is a hybrid layer including silicon oxide and silicon nitride.

19. The semiconductor structure according to claim 18, wherein:
the dielectric layer is further formed through the hard mask layer.

20. The semiconductor structure according to claim 18, wherein:
an opening is formed over the power rail, the opening having a sidewall formed by sidewalls of the isolation structure and the hard mask layer.

* * * * *